United States Patent
Lin

[11] Patent Number: 5,863,707
[45] Date of Patent: Jan. 26, 1999

[54] METHOD FOR PRODUCING ULTRA-FINE INTERCONNECTION FEATURES

[75] Inventor: Ming-Ren Lin, Cupertino, Calif.

[73] Assignee: Advanced Micro Devices, Inc., Sunnyvale, Calif.

[21] Appl. No.: 798,992

[22] Filed: Feb. 11, 1997

[51] Int. Cl.$^6$ .................................................. G03C 5/00
[52] U.S. Cl. ...................... 430/313; 430/317; 430/318
[58] Field of Search .................................. 430/313, 322, 430/325, 317, 318, 312, 430

[56] References Cited

U.S. PATENT DOCUMENTS

| | | | |
|---|---|---|---|
| 4,641,420 | 2/1987 | Lee ............................................. | 29/511 |
| 4,944,836 | 7/1990 | Beyer et al. .............................. | 156/645 |
| 4,965,226 | 10/1990 | Gootzen et al. ......................... | 437/189 |
| 5,093,279 | 3/1992 | Andreshak et al. ..................... | 457/173 |
| 5,096,849 | 3/1992 | Beilstein, Jr. et al. .................. | 437/67 |
| 5,198,693 | 3/1993 | Imken et al. ............................. | 257/720 |
| 5,262,354 | 11/1993 | Cote et al. ............................... | 437/195 |
| 5,651,857 | 7/1997 | Cronin et al. ......................... | 156/644.1 |
| 5,667,632 | 9/1997 | Burton et al. ............................ | 438/570 |
| 5,719,089 | 2/1998 | Cherng et al. ........................... | 438/637 |

FOREIGN PATENT DOCUMENTS

| | | |
|---|---|---|
| 63-253647 | 10/1988 | Japan . |
| 2251722 | 7/1992 | United Kingdom . |

OTHER PUBLICATIONS

Joshi, "A New Damascene Structure for Submicrometer Interconnect Wiring," IEEE Electron Device Letters, vol. 14, No. 3, Mar. 1993, pp. 129–132.

Kaanta et al., "Dual Damascene: A ULSI Wiring Technology," Jun. 11–12, 1991, VMIC Conference, IEEE, pp. 144–152.

Kenney et al., "A Buried–Plate Trench Cell for a 64–Mb DRAM," 1992 Symposium on VLSI Technology Digest of Technical Papers, IEEE, pp. 14–15.

*Primary Examiner*—Janet C. Baxter
*Assistant Examiner*—Rosemary Ashton
*Attorney, Agent, or Firm*—McDermott, Will & Emery

[57] ABSTRACT

Sub-micron contacts/vias and conductive lines in a dielectric layer are formed by etching through a photoresist mask containing openings having a dimension less than that achievable by conventional photolithographic techniques. Such minimal size openings are obtained by initially forming an oversized opening by conventional photolithographic techniques and then reducing the size of the opening by forming a sidewall spacer, such as a dielectric sidewall spacer, within the opening. In an embodiment, a plurality of openings are formed in first photoresist layer, each of which openings is provided with a sidewall spacer. The openings are filled with a filling material, such as a second photoresist material, and the photoresist mask and sidewall spacers are removed leaving a plurality of masking portions containing the second photoresist material. An underlying conductive layer is then etched through masking portions to form conductive lines having sub-micron dimensions.

30 Claims, 6 Drawing Sheets

METHOD FOR PRODUCING ULTRA-FINE INTERCONNECTION FEATURES

TECHNICAL FIELD

The present invention relates to a method of manufacturing a semiconductor device containing an interconnection structure comprising conductive wiring and conductive contacts/vias with ultra-fine features. The invention has particular application in deep-sub-micron circuit manufacturing.

BACKGROUND ART

The escalating requirements for increased densification and performance in ultra-large scale integration semiconductor wiring require responsive changes in interconnection technology. High density demands for ultra-large scale integration semiconductor wiring require planarized conductive patterns comprising contacts/vias, conductive lines and/or interwiring spacings with a maximum dimension of less than about 0.35 microns.

A traditional method for forming interconnection structures comprises the use of a subtractive etching or etch back step as the primary metal patterning technique. Such a traditional method comprises depositing a dielectric layer on a semiconductor substrate, typically monocrystalline silicon, and forming conductive contacts/vias in the insulating layer. A metal layer, such as tungsten, aluminum, or an alloy thereof, is deposited on the insulating layer, and a photoresist mask is formed on the metal layer having a pattern corresponding to the desired conductive pattern. The metal layer is then etched through the photoresist mask to form the conductive pattern. A dielectric layer is then applied to the resulting conductive pattern filling in the interwiring spaces between the conductive lines.

There are various problems attendant upon the traditional etch back technique. For example, it is difficult to form an adequately planarized layer subsequent to filling in the interwiring spacings between the conductive lines, as by conventional etching and chemical-mechanical polishing (CMP) planarization techniques, particularly with reduced interwiring spacings. In addition, the traditional etch back technique often results in the generation of voids in the filled-in interwiring spacings. Additional difficulties include trapping of impurities of volatile materials in the interwiring spacings thereby exposing the semiconductor device to potential damage. Moreover, it is difficult to provide adequate step courage using the traditional etch back technique.

Prior attempts to overcome the disadvantages of the traditional etch back technique involve the application of damascene to form a conductive pattern. Damascene is an art which has been employed for centuries in the fabrication of jewelry, and has recently been adapted for application in the semiconductor industry. Damascene basically involves the formation of an opening for a contact or via, or a trench, typically a substantially horizontally extending trench, which is filled with a metal. Thus, damascene differs from the traditional etch back technique of providing an interconnection structure by forming a pattern of trenches in a dielectric layer, which trenches are filled in with metal to form the conductive pattern followed by planarization vis-à-vis the traditional etch back technique of depositing a metal layer, forming a conductive pattern with interwiring spacings, and filling in the interwiring spacings with dielectric material. Double damascene techniques can be utilized to form both a contact/via and trench simultaneously filled with a conductive material.

As the design requirements for interconnection patterns become more severe in requiring maximum dimensions less than about 0.35 microns, particularly less than about 0.25 microns, the ability of conventional methodology to meet such demands with acceptable accuracy becomes increasingly more difficult. A limitation on achieving such fine dimensions resides in the inability of conventional photolithographic and etching techniques to satisfy the accuracy requirements for such fine feature sizes. Conventionally, in providing feature sizes having a small dimension, such as about 0.30 to about 0.40 microns or greater, I-line photolithography is employed. As the maximum dimension is reduced, e.g., to below about 0.30 microns, such as less than about 0.25 microns, it is necessary to resort to shorter wavelengths, such as deep ultra-violet light. However, it is very difficult to form fine line patterns or through-holes with a maximum dimension of about 0.25 microns or less with any reasonable degree of accuracy, consistency and efficiency, and to produce a controlled sidewall by a simple etching process.

In co-pending application Ser. No. 08/528,279 filed on Sep. 14, 1995, now Ser. No. 08/974,687 a method is disclosed for forming sub-micron contacts/vias and trenches in a dielectric layer, which method comprises forming an opening having an initial dimension and reducing the initial dimension by forming a dielectric sidewall in the opening to reduce the initial dimension to a smaller final dimension. The entire disclosure of co-pending application Ser. No. 08/528,279 now Ser. No. 08/974,687 is incorporated herein by reference. Japanese Patent Document 63-253647, Lee, U.S. Pat. No. 4,641,420 and UK Patent Application GB 2,251,722A disclose methods of forming contacts/vias in dielectric layers having a sidewall spacer therein.

There exists a need for a cost effective, simplified method of accurately forming interconnection structures with ultra-fine feature dimensions, e.g., less than about 0.25 microns. There also exists a need for a method of forming such ultra fine features using conventional photolithographic equipment without resort to e-beam or X-ray lithographic techniques.

DISCLOSURE OF THE INVENTION

An object of the present invention is a method for manufacturing a semiconductor device having ultra-fine feature sizes.

Another object of the present invention is a method of manufacturing a semiconductor device having ultra-fine features less than about 0.30 microns, employing conventional photolithographic techniques without resort to e-beam or X-ray lithographic techniques.

Additional objects, advantages and other features of the invention will be set forth in part in the description which follows and in part will become apparent to those having ordinary skill in the art upon examination of the following or may be learned from practice of the invention. The objects and advantages of the invention may be realized and obtained as particularly pointed out in the appended claims.

According to the present invention, the foregoing and other objects are achieved in part by a method of manufacturing a semiconductor device, which method comprises: forming a first layer having an upper surface and a lower surface; depositing a first photoresist layer, comprising a first photoresist material, having an upper surface and a lower surface on the upper surface of the first layer; forming a mask pattern in the first photoresist layer, which mask pattern comprises at least one opening extending through the photoresist mask, which opening has a first dimension defined by side surfaces and a bottom; and depositing a film of spacer material in the photoresist mask opening to form a dielectric sidewall spacer therein to reduce the first dimension to a second dimension defined by the sidewall spacer.

A further aspect of the invention is a method of manufacturing a semiconductor device which method comprises: forming a dielectric layer, comprising a first dielectric material, having an upper surface and a lower surface; depositing a photoresist layer having an upper surface and a lower surface on the upper surface of the dielectric layer; forming a mask pattern in the first photoresist layer, which mask pattern comprises at least one opening extending through the photoresist mask, which opening has a first dimension defined by side surfaces and a bottom; depositing a film of a spacer material, different from the first dielectric material, in the photoresist mask opening to form a sidewall spacer therein to reduce the first dimension to a second dimension defined by the sidewall spacer; etching the underlying dielectric layer through the opening in the photoresist mask having the reduced second dimension to form an opening in the underlying dielectric layer having a dimension substantially corresponding to the second dimension; and filling the opening in the underlying dielectric layer with a conductive material.

Another aspect of the present invention is a method of manufacturing a semiconductor device, which method comprises: forming a conductive layer having an upper surface and a lower surface; depositing a first photoresist layer, comprising a first photoresist material, having an upper surface and a lower surface on the upper surface of the conductive layer; forming a mask pattern in the first photoresist layer comprising a plurality of openings extending through the photoresist mask, each opening having a first dimension defined by side surfaces and a bottom; depositing a film of spacer material in the photoresist mask openings to form a sidewall spacer within each opening to reduce the first dimension to a second dimension defined by the sidewall spacer; filling the opening in the first photoresist layer with a filling material different from the first photoresist material; removing the remaining first photoresist layer and sidewall spacers leaving a mask pattern comprising a plurality of masking portions of the filling material; and etching the underlying conductive layer, using the masking portions comprising the filling material, to form a plurality of conductive lines in the conductive layer.

Additional objects and advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

DESCRIPTION OF THE INVENTION

The present invention is directed to a method of manufacturing a semiconductor device comprising features, such as conductive contacts/vias and lines of an interconnection pattern, wherein the profiles of the features are controlled with high accuracy to achieve ultra-fine sizes, such as less than about 0.30 microns, for example, as low as about 0.15 microns. In accordance with the present invention, an interconnection pattern comprising features having such accurate minimal dimensions is achieved by a simplified technique, employing conventional photolithographic equipment and techniques, without resorting to costly and complex techniques, such as e-beam and X-ray lithographic techniques, thereby reducing the overall manufacturing cost. The inventive method, however, is also applicable to semiconductor devices having relatively large geometry, and is compatible with both damascene and etch back techniques. Significantly, the inventive method yields semiconductor devices having an increased operating speed and improved reliability, precision, accuracy, efficiency, wear characteristics and signal-to-noise ratio.

As previously discussed, the decreasing dimensions required by the escalating requirements for increased densification and miniaturization stretches the limitations of conventional photolithographic and etching techniques. Photolithographic processes comprising the use of shorter wavelengths, e-beam and X-rays have proven complex and expensive. The present invention, however, extends the utility of existing photolithographic equipment and techniques to ultra-fine feature size patterning applications otherwise virtually impossible or impractical with existing photolithographic equipment. The present invention achieves that objective by a simplified sidewall spacer technique which extends the capability of existing photolithographic technology and equipment to deep-sub-micron geometry.

In accordance with the present invention, a first layer having an upper surface and a lower surface is formed. The first layer can be either a dielectric layer, as for damascene processing, or a conductive layer for etch back techniques. Optionally, a dielectric etch stop layer is provided on the upper surface of the first dielectric or conductive layer.

A photoresist layer is then formed on the upper surface of the first dielectric or conductive layer, or the optional etch stop layer and a mask pattern formed in the photoresist layer using conventional photolithographic and etching techniques. The resulting photoresist mask comprises at least one oversized opening extending through the photoresist mask and having a first dimension defined by sidewalls. The first opening dimension is greater than a desired or targeted dimension but fully within the capabilities of conventional photolithographic and etching techniques without resort to expensive and complex techniques, such as e-beam or X-ray lithographic techniques, e.g., about 0.40 microns or greater. In accordance with the present invention, when the first layer is a dielectric material or conductive material, either a conventional positive working photoresist material or conventional negative working photoresist material can be employed for the photoresist mask.

A film of spacer material is then deposited in the photoresist mask opening to form a sidewall spacer to reduce the first oversized dimension to a second targeted dimension defined by the sidewall spacer. Thus, an opening in a photoresist mask is provided having an ultra-fine second dimension which cannot be accurately formed with conventional photolithographic technology employed to form the initial opening having an oversized first dimension. The spacer material can comprise any of various dielectric and conductive materials conventionally employed in the art of manufacturing semiconductor devices. In the various embodiments of the present invention, it has been found preferable to employ a dielectric material as the sidewall spacer.

After forming the photoresist mask opening having a reduced second dimension defined by the sidewall spacer, e.g., dielectric sidewall spacer, the underlying dielectric layer is etched, as by anisotropic etching, e.g., reactive ion etching, to form an opening therein having a dimension substantially equal to the reduced, ultra-fine second dimension of the photoresist mask opening. The resulting ultra-fine opening in the dielectric layer can be a through-hole for forming a conductive contact/via, or a trench for forming a conductive line. The opening is then filled with a conductive material, such as a metallic material, e.g., aluminum, copper, tungsten, or an alloy thereof, or polycrystalline silicon. The resulting ultra-fine conductive via/contact or conductive line is thereby formed by a simplified dielectric sidewall technique employing conventional photolithographic and etching equipment and techniques which cannot be directly employed to accurately form such an ultra-fine feature size.

In embodiments wherein the first layer is a conductive layer, a first photoresist layer is formed comprising a first photoresist material, e.g., a negative working photoresist material. One or more, preferably a plurality of openings, are then formed in the first photoresist layer to form a mask employing conventional photolithographic technology, wherein the openings have a first oversized dimension defined by the side surfaces thereof. The first opening oversized dimensions are fully within the capabilities of conventional photolithographic technology, e.g., about 0.40 microns or greater. A sidewall spacer, e.g., a dielectric sidewall spacer, is then formed in each opening to reduce the first oversized dimension to a second dimension defined by the dielectric sidewall spacer, which second dimension cannot accurately be formed with conventional photolithographic technology.

Subsequently, each opening having the reduced dimension is filled with a removable filling material, e.g., capable of being removed by etching during subsequent processing. Such filling material can comprise any of various dielectric materials, including spin-on glass, or a photoresist material. In the various embodiments of the present invention, the filling material is preferably a second photoresist material which is different from the first photoresist material. The openings can be filled by depositing a layer of the filling material, e.g., second photoresist material, on the upper surface of the photoresist mask, filling each opening of the mask with the second photoresist material. Subsequently, the second photoresist layer is removed from the upper surface of the photoresist mask leaving the openings therein filled with the second photoresist material. Removal of the second photoresist layer can be effected by conventional planarization techniques, such as mechanical polishing, chemical-mechanical polishing or etching.

In an aspect of this embodiment of the inventive method, the photoresist mask and sidewall spacers are then removed (e.g., by a blanket etch back technique) leaving a mask pattern comprising a plurality of ultra-fine masking portions of the second dielectric material previously filling the reduced dimension openings of the photoresist mask. The underlying conductive layer is then etched through the plurality of ultra-fine masking portions to form a plurality of conductive lines in the underlying conductive layer, which conductive lines have a dimension substantially the same as the reduced, ultra-fine dimension of the respective masking portions.

In other aspects of this embodiment of the present invention, the filling material, e.g., second photoresist layer, is removed from the upper surface of the photoresist mask and the photoresist mask is also removed in a single etching step. This cost effective procedure and reduction in manipulative steps can be achieved by selecting appropriate materials for the first photoresist material, filling material, e.g., second photoresist material, and etchant. One having ordinary skill in the art, given the guidance of the present disclosure, can easily select appropriate materials and etchant to practice such an etching sequence.

In another aspect of this embodiment, the filling material, e.g., second photoresist layer, is removed from the upper surface of the photoresist mask in a first etching step, the photoresist mask is removed in a second etching step, and the sidewall spacer is removed in a third etching step.

In accordance with the present invention, the dielectric material employed to form to the dielectric sidewall spacer can comprise any dielectric material, such as a silicon oxide, silicon nitride or silicon oxynitride. In embodiments of the present invention wherein an underlying dielectric layer is etched, the material for the sidewall spacer is selected so that it exhibits etching characteristics different from those of the dielectric material of the underlying dielectric layer, enabling etching selectivity when etching the underlying dielectric layer. The optional dielectric etch stop layer can also comprise a silicon oxide, silicon nitride or silicon oxynitride and is selected on the basis of its etching characteristics vis-à-vis the underlying dielectric layer. It has been found useful to employ an optional dielectric etch stop layer comprising a silicon dioxide derived from tetraethyl orthosilicate.

In embodiments of the present invention, the sidewall spacer, such as a dielectric sidewall spacer, is formed by depositing a film of spacer material on the upper surface of the photoresist layer, and on the side surfaces of the opening or openings therein covering the bottom of the opening. Subsequently, a blanket anisotropic etching technique, e.g., reactive ion etching, is conducted to remove the spacer material film from the upper surface of the thin photoresist layer and from the bottom of the opening, thereby forming a dielectric sidewall spacer in each opening extending substantially from the upper surface to the lower surface of the photoresist mask. It is to be understood that the present invention is not confined to the use of a dielectric material for a sidewall spacer. Given the guidance of the present invention and objectives, one having ordinary skill in the art can easily select an appropriate spacer material, conductive or dielectric, for use as in forming a sidewall spacer in accordance with the present invention.

In accordance with the present invention, an opening in a photoresist mask having a first dimension is formed within the accuracy capabilities of conventional photolithographic technology. The first dimension opening is then reduced to a second dimension by forming a sidewall spacer therein which is beyond the accuracy capabilities of such conventional photolithographic technology employed to form the first dimension opening. The present invention is not limited to the formation of openings having any particular first dimension or second dimension. However, the present invention can be advantageously employed to provide ultra-fine features, such as openings having a second dimension less than about 0.30 microns, for example, of about 0.15 to about 0.25 microns, employing conventional photolithographic technology not directly capable of accurately providing such ultra-fine dimensions. The sidewall spacers provided in the openings of the photoresist mask can have a thickness not less than about 0.50 microns, e.g., not less than about 0.10 microns.

The inventive methodology can be illustrated by targeting a final dimension for a conductive via/contact or line at less than about 0.30 microns and forming an opening in the initial photoresist mask with an initial dimension greater than about 0.30 microns, such as about 0.40 microns or greater, employing conventional photolithographic techniques which are accurate and reliable for such oversized dimensions. After the initial oversized opening is formed with an initial dimension greater than the targeted dimension, the initial dimension is reduced by forming a sidewall spacer in the opening, e.g., a thickness of greater than about 0.50 microns. In this way, openings of about 0.15 microns to less than about 0.30 microns are formed accurately and reliably.

An embodiment of the present invention wherein a conductive via/contact hole or line is formed in a dielectric layer is illustrated in FIGS. 1 through 4. Adverting to FIG. 1, a layer of dielectric material 10 is formed, and optional hard mask 11 is formed on dielectric layer 10. Dielectric layer 10 can comprise, for example, silicon dioxide. The optional hard mask 11 serves as an etch stop layer and can comprise a conventional etch stop material, such as a silicon nitride or silicon oxynitride. A photoresist layer 12 is then deposited on dielectric layer 10 or optional hard mask 11 if present. A photoresist mask is formed in photoresist layer 12 comprising at least one opening 13 using conventional photolithographic and etching equipment and techniques. Opening 13 has a first dimension $D_1$ defined by side surfaces 14. The first dimension $D_1$ exceeds the desired ultra-fine feature size; however, it is within the accuracy capabilities of conventional photolithographical technology.

Figure 1:
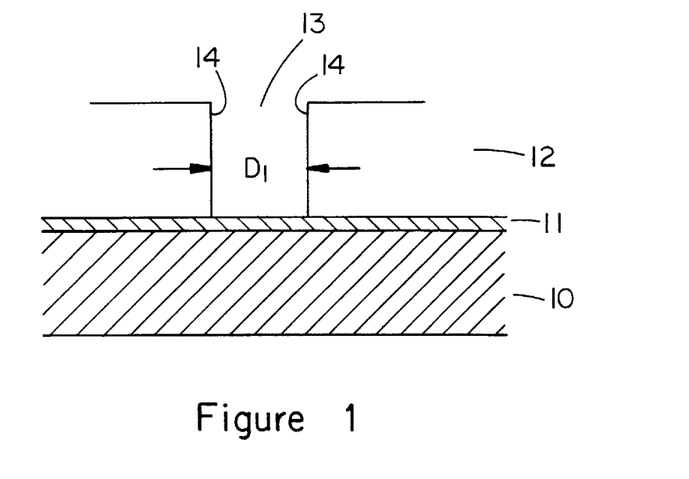
FIGS. 1 through 4 are cross-sectional views of sequential stages in an embodiment of the present invention.
Figure 2:
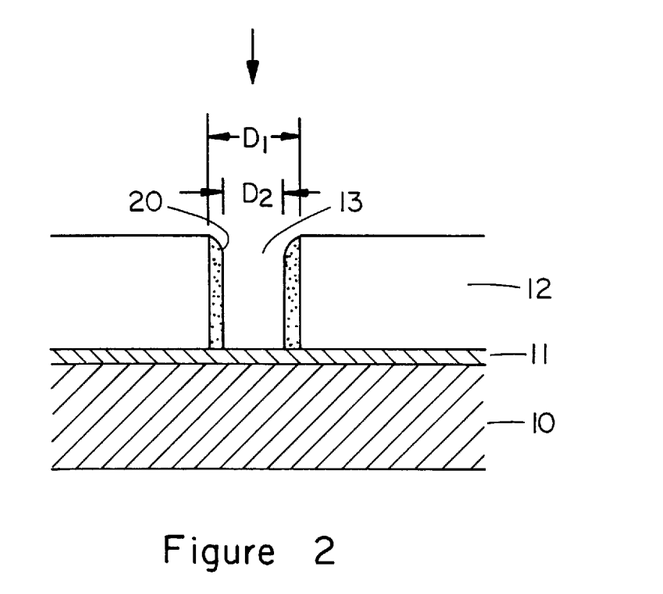

As shown in FIG. 2, in accordance with the present invention, a sidewall spacer 20, e.g., dielectric sidewall spacer, is formed extending substantially from the upper surface to the lower surface of photoresist mask 12. Dielectric sidewall spacer 20 reduces the first dimension $D_1$ of opening 13 to a second dimension $D_2$, defined by the dielectric sidewall spacer 20.

Figure 3A:
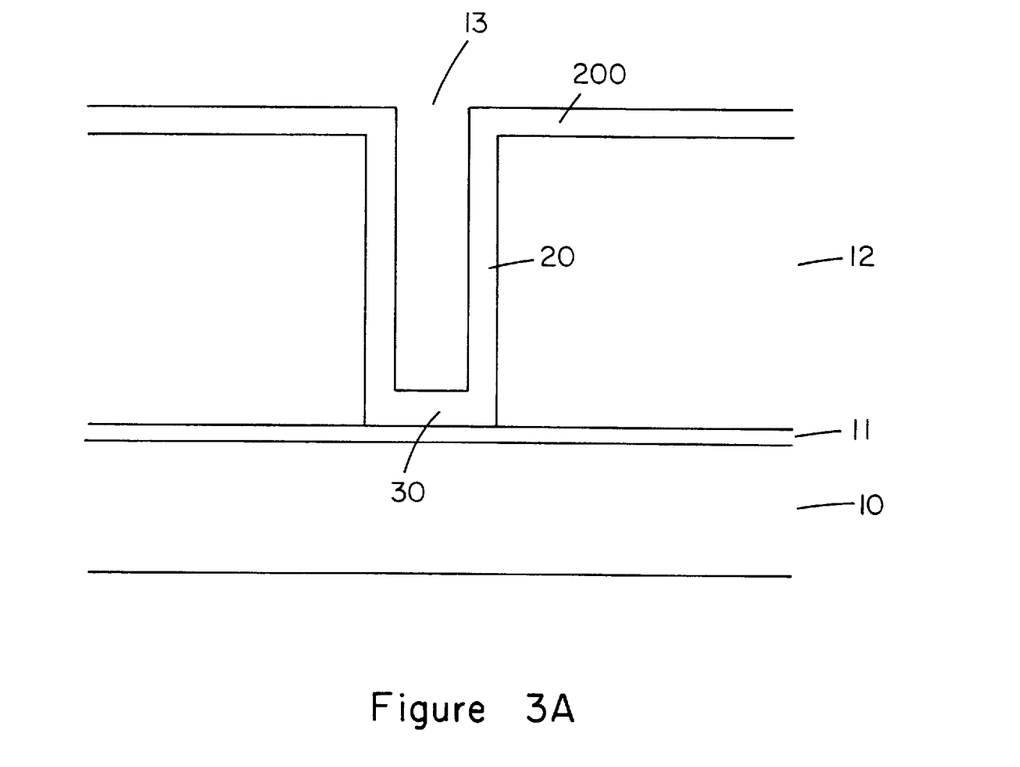
Figure 3B:
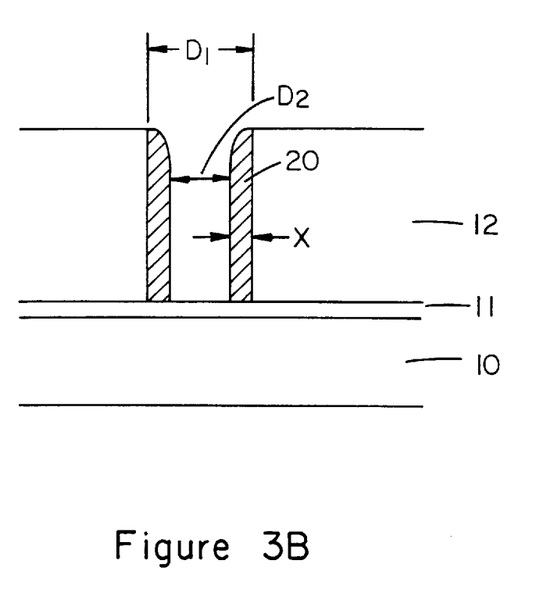

Dielectric sidewall spacer 20 can be formed by a blanket CVD or sputter deposition technique followed by a blanket etch back technique employing reactive ion etching. For example, as shown in FIG. 3A, a thin film of dielectric material 200 is deposited on the upper surface of photoresist mask 12 and the side surfaces of opening 13 to form sidewall spacers 20 and a thin film 30 on the bottom of opening 13. As shown in FIG. 3B, the thin film of dielectric material 200 is removed from the upper surface of photoresist mask 12 and film 30 is removed by etching, leaving sidewall spacer 20 having a thickness X, thereby reducing the initial first dimension $D_1$ to a second dimension $D_2$ defined by the sidewall spacer 20 extending substantially from the upper surface substantially to the lower surface of photoresist mask.

As shown in FIG. 3B, upon blanket anisotropic etching to remove the thin film of dielectric material 200 from the surface of first photoresist layer 12 and thin film 30 at the bottom of opening 13, a minor portion of dielectric sidewall spacer 20 is reduced; however, such a reduction is insignificant and does not materially affect the ultimate objective of forming an opening with a reduced dimension $D_2$.

Thus, a minimal masking dimension of between about 0.15 and about 0.30 microns is achieved by initially forming an oversized opening in a photoresist mask and reducing the oversized opening to the targeted maximum dimension by forming a thin dielectric sidewall spacer in the oversized opening. In this way, an initial opening $D_1$ is reduced by a value approximately equal to twice the thickness X of dielectric sidewall spacer 20 to a final dimension $D_2$ typically less than about 0.30 microns, for example, between about 0.15 microns to about 0.25 microns.

Figure 4:
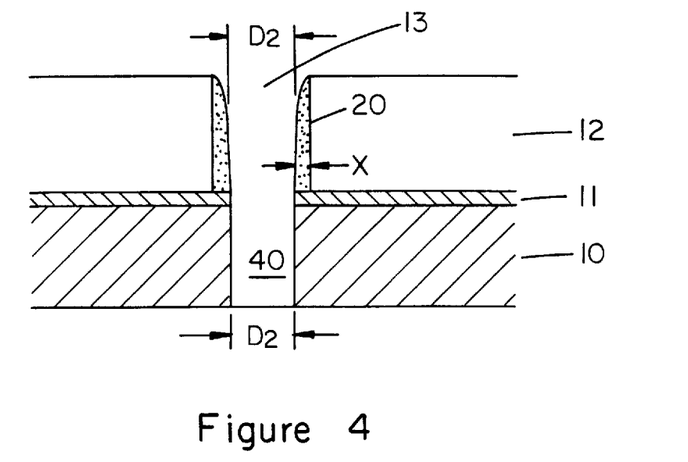
Figure 5:
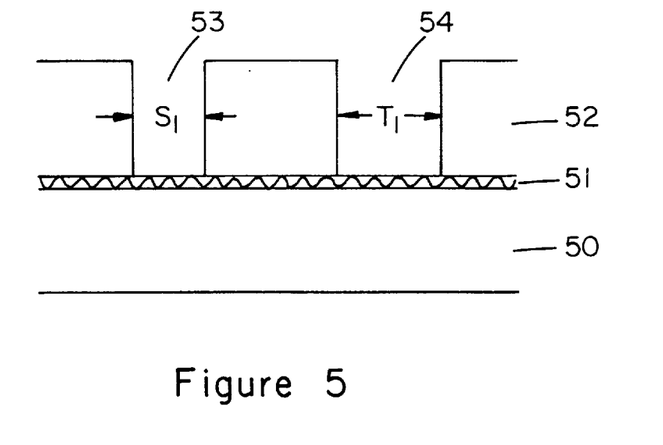
FIGS. 5 through 10 are cross-sectional views of sequential stages in another embodiment of the present invention.

Adverting to FIG. 4, after forming sidewall spacer 20, underlying dielectric layer 10, and optional hard mask 11 present, are etched to form an opening 40 therein having a dimension substantially equal to the second dimension $D_2$ which is equal to $D_1$ less twice the thickness X of dielectric sidewall spacer 20. Thus, a damascene opening 40 is formed in dielectric layer 10 having a dimension $D_2$ beyond the accuracy limitations of conventional photolithographic technology employed to form the initial photoresist mask opening having a dimension $D_1$. Damascene opening 40 is then filled with a conductive material, such as a metallic material, for example, aluminum, copper, tungsten, or an alloy thereof, or polycrystalline silicon, thereby forming a conductive via/trench or line having an ultra-fine feature size less than about 0.35 microns, even down to about 0.15 microns.

An embodiment in accordance with the present invention wherein conductive lines are etched in a conductive layer is illustrated with respect to FIGS. 5 through 10. Adverting to FIG. 5, conductive layer 50 is formed, typically comprising a metallic material or polycrystalline silicon. As in the embodiment described with respect to FIGS. 1 through 4, an optional hard mask 51, comprising a conventional etch stop material, is deposited on conductive layer 50. A first photoresist mask 52 is then formed on conductive layer 50, or optional etch stop layer 51 if present. First photoresist mask 52 is formed employing conventional technology by depositing a photoresist layer image-wise exposing the photoresist and developing to form a plurality of openings 53 and 54 having first dimensions $S_1$ and $T_1$, respectively. Openings 53 and 54 formed by conventional photolithographic technology are oversized vis-à-vis the ultimate targeted ultra-fine dimensions of conductive lines to be formed in underlying conductive layer 50.

Figure 6:
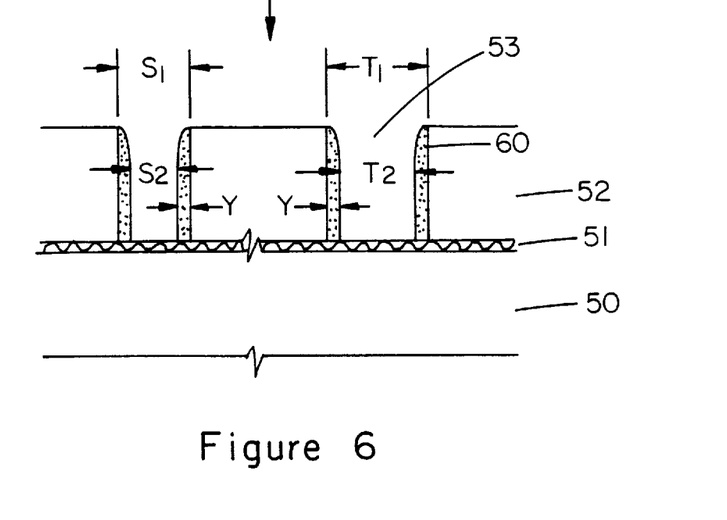
Figure 7:
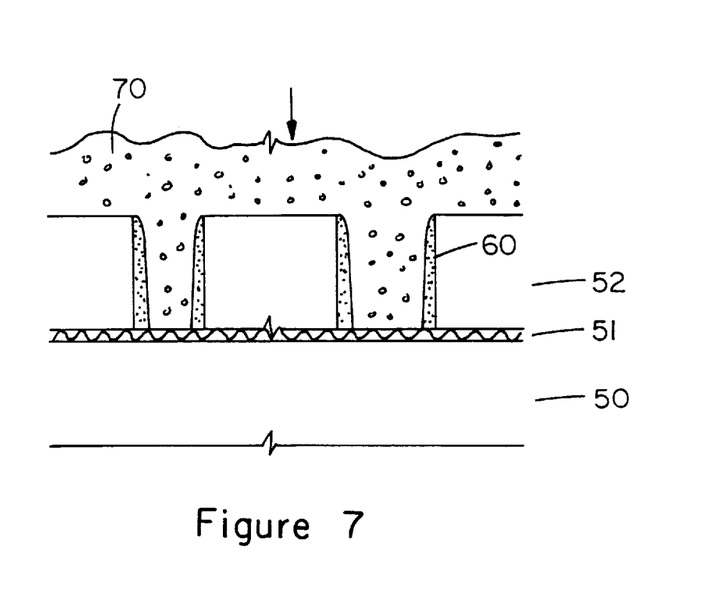

As shown in FIG. 6, sidewall spacers 60, e.g., dielectric sidewall spacers, having a thickness Y, are formed in openings 53 and 54, to reduce the first dimensions $S_1$ and $T_1$ by a factor of about two times the thickness Y of the dielectric sidewall spacer to second dimensions $S_2$ and $T_2$, respectively. Subsequently, as shown in FIG. 7, a layer 70 of a filling material, e.g., a second photoresist material different from the first photoresist material of the first photoresist layer, is deposited on the photoresist mask. The second photoresist material fills openings 53 and 54, and is selected based upon its etching characteristics vis-à-vis the etching characteristics of the first photoresist material. The second photoresist material fillings 70A and 70B ultimately serve as masking portions of a mask pattern for etching the underlying conductive layer.

Figure 8:
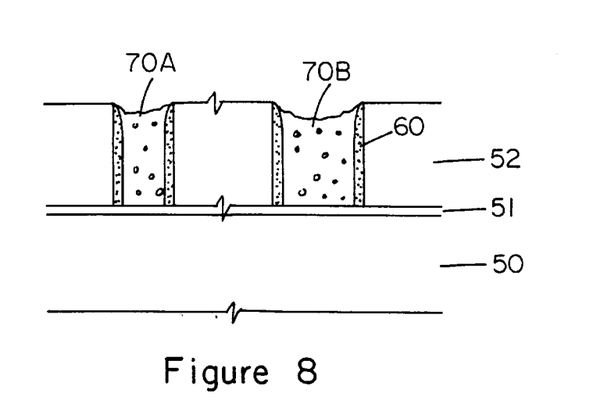
Figure 9:
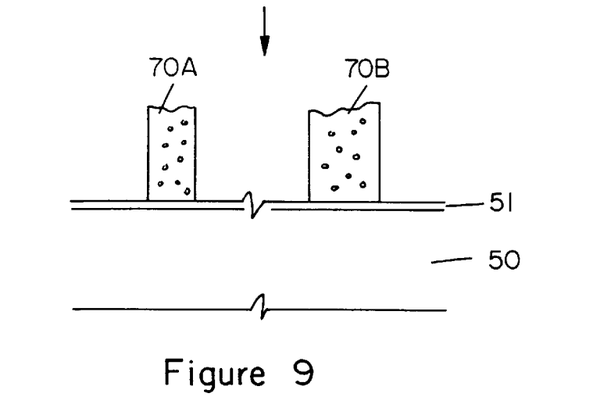

Adverting to FIG. 8, second photoresist layer 70 is then etched to remove portions thereof from the underlying photoresist mask 52, leaving openings 53 and 54 filled with second photoresist material 70A and 70B, respectively. As shown in FIG. 9, photoresist mask 52 and dielectric sidewall spacers 60 are then removed, e.g., reactive ion etching, leaving a mask pattern comprising a plurality of masking portions 70A and 70B comprising the second photoresist material which previously occupied openings 53 and 54 in photoresist mask 52. Masking portions 70A and 70B have an accurately formed ultra-fine dimension, i.e., less than about 0.30 microns, substantially corresponding to the reduced thicknesses $S_2$ and $T_2$, respectively.

It should be understood that the etching sequence can be varied by appropriate selection by materials for the filling material, first photoresist material and sidewall spacer material, and etchants. For example, the first photoresist material, sidewall spacer material and filling material can be selected so that the filling material 70 and photoresist mask 52 are removed in one etching operation, followed by removal of the sidewall spacer to leave the filling material 70A and 70B serving as a mask. Alternatively, the filling material can be removed from the underlying photoresist mask 52 in a first etching step, the photoresist mask can be removed in a second etching step and the sidewall spacer 60 can be removed in a third etching step, leaving masking portions 70A and 70B.

Figure 10:
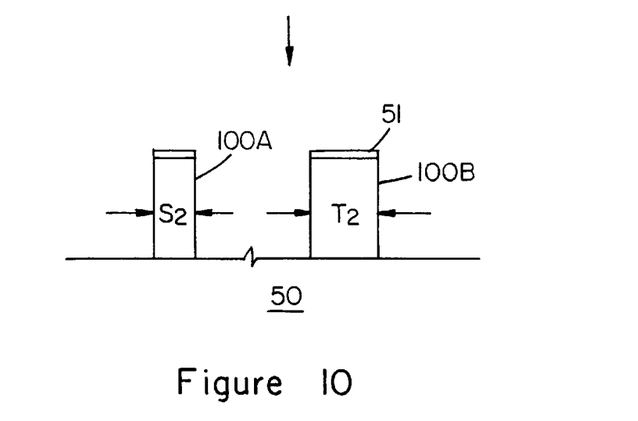

As shown in FIG. 10, underlying conductive layer 50 is then etched using masking portions 70A and 70B to form conductive lines 100A and 100B, respectively. Conductive line 100A has an ultra-fine dimension substantially equal to second dimension $S_2$ which is substantially equivalent to the initially formed dimension $S_1$ in opening 53 less twice the thickness Y of dielectric sidewall spacer 60. Conductive line 100B has an ultra-fine dimension substantially equal to $T_2$ which is substantially equal to the original dimension $T_1$ of mask opening 54 less twice the thickness Y of dielectric sidewall spacer 60. Thus, the use of sidewall spacers 60 within the initial photoresist mask openings 53 and 54 enables the formation of conductive lines 100A and 100B with ultra-fine dimensions, e.g., less than about 0.30 microns, which ultra-fine dimensions exceed the accuracy limitations of the photolithographic equipment and techniques employed to produce the mask openings 53 and 54.

The various embodiments of the present invention comprise the formation of conductive vias/contact holes and conductive lines comprising conductive material conventionally employed in fabricating interconnection structures, such as polycrystalline silicon, aluminum, tungsten, copper, and alloys thereof, with and without an adhesion/barrier layer. The conductive material can be deposited by techniques which are known in the art. For example, metallization techniques such as various types of chemical vapor deposition (CVD) processes, including low pressure chemical vapor deposition (LPCVD) and plasma enhanced chemical vapor deposition (PECVD) may be employed. Normally, when high melting point metals such as tungsten are deposited, CVD techniques are employed. Low melting point metals, such as aluminum and aluminum-base alloys, including aluminum-copper alloys, may be deposited by melting, reflow or sputtering. Polycrystalline silicon can also be employed as a conductive material in the interconnection pattern. The embodiments of the present invention employ known planarization techniques, such as conventional etching and CMP planarization techniques.

The various embodiments of the present invention involve the formation of openings employing conventional photolithographic techniques, including the use of a photoresist mask, etch recipes, and etching techniques as, for example, plasma etching and reactive ion etching. An etch stop layer, such as a nitride layer, e.g., silicon nitride ($Si_3N_4$) or a silicon oxynitride, may also be employed consistent with conventional practices. Etch stop layers are conventionally employed in the art of semiconductor manufacturing, as are the methods of metal deposition, e.g., CVD, or plating.

The various embodiments of the present invention involve conventional dielectric layers, such as oxide layers, e.g., layers of silicon oxide, formed in a conventional manner, as from deposited tetraethyl orthosilicate (TEOS), thermal oxidation of a deposited silicon layer, PECVD, thermal enhanced CVD and spin-on techniques.

The present invention enables the accurate and reliable formation of conductive patterns having an ultra-fine dimension less than about 0.30 microns, for example, about 0.15 microns to about 0.25 microns, employing conventional photolithographic technology incapable of directly achieving such ultra-fine dimensions. The present invention effectively circumvents the limitations of conventional, in place, photolithographic equipment, i.e., the difficulty in accurately patterning dimensions less than about 0.30–0.40 microns with a high degree of accuracy and control. In accordance with the present invention, conventional photolithographic technology is utilized to form an opening in a photoresist layer having a dimension larger than a targeted dimension. Subsequently, the initial oversized dimension is reduced to the targeted dimension, e.g., less than about 0.30 microns, by forming a sidewall spacer.

The present invention provides a simplified manufacturing technique which significantly expands the utility of current photolithographic and etching equipment and techniques, notwithstanding their inherent limitations, thereby increasing the life span of conventional tools. In addition, the present efficient, cost effective inventive methodology yields semiconductor devices having an increased operating speed, and improved reliability, precision, accuracy, efficiency, wear characteristics and an improved signal-to-noise ratio.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:
   forming a first layer having an upper surface and a lower surface;
   depositing a first photoresist layer, comprising a first photoresist material, having an upper surface and a lower surface on the upper surface of the first layer;
   forming a mask pattern in the first photoresist layer, which mask pattern comprises at least one opening extending through the photoresist mask, which opening has a first dimension defined by side surfaces and a bottom; and
   depositing a film of spacer material in the photoresist mask opening to form a sidewall spacer therein to reduce the first dimension to a second dimension of the opening defined by the sidewall spacer.

2. The method according to claim 1, wherein the spacer material comprises a dielectric material.

3. The method according to claim 2, wherein the dielectric material comprises silicon dioxide, silicon nitride, a silicon oxynitride, a spin on material or a chemical vapor deposited material.

4. The method according to claim 3, wherein the dielectric material comprises silicon dioxide derived from deposited tetraethyl orthosilicate.

5. The method according to claim 2, wherein the first layer comprises a dielectric material different from the dielectric sidewall spacer material, which method further comprises etching the underlying dielectric layer through the opening in the photoresist mask having the reduced second dimension to form an opening in the underlying dielectric layer having a dimension substantially corresponding to the second dimension.

6. The method according to claim 5, further comprising filling the opening in the dielectric layer with a conductive material.

7. The method according to claim 6, wherein the filled opening comprises a conductive via or conductive contact hole.

8. The method according to claim 6, wherein the filled opening comprises a damascene conductive line of a conductive pattern.

9. The method according to claim 1, further comprising:
   depositing a dielectric etch stop film on the upper surface of the first layer; and
   depositing the first photoresist layer on the dielectric etch stop film.

10. The method according to claim 9, wherein the dielectric etch stop film comprises silicon dioxide, silicon nitride or a silicon oxynitride.

11. The method according to claim 1, comprising:
    depositing a film of spacer material on the upper surface of the first photoresist layer, on the side surfaces of the opening and covering the bottom of the opening; and
    blanket anisotropically etching to remove the film of spacer material from the upper surface of the first photoresist layer and from the bottom of the opening, to form the sidewall spacer in the opening extending substantially from the upper surface substantially to the lower surface of the first photoresist mask.

12. The method according to claim 1, wherein the first photoresist layer comprises a positive or negative working photoresist material.

13. The method according to claim 1, wherein the second dimension is less than about 0.30 microns.

14. The method according to claim 13, wherein the second dimension is about 0.15 to about 0.25 microns.

15. The method according to claim 1, wherein the thickness of the sidewall spacer is not less than about 0.50 microns.

16. The method according to claim 15, wherein the thickness of the sidewall spacer is not less than about 0.10 microns.

17. The method according to claim 1, wherein the first layer comprises a conductive material, and the method further comprises filling the opening having the second dimension in the first photoresist layer with a filling material which is different from the first photoresist material.

18. The method according to claim 17, wherein the filling material comprises a second photoresist material.

19. The method according to claim 18, wherein the opening is filled with the second photoresist by:
    depositing a second photoresist layer, comprising the second photoresist material, on the upper surface of the first photoresist layer and filling the opening in the first photoresist layer with the second photoresist material; and
    removing the second photoresist layer from the upper surface of the first photoresist layer leaving the opening in the first photoresist layer filled with the second photoresist material.

20. The method according to claim 19, further comprising sequentially:
    removing the first photoresist layer; and then removing the sidewall spacer leaving a masking portion comprising the second photoresist material.

21. The method according to claim 19, wherein
    the second photoresist layer is removed from the upper surface of the first photoresist layer and the first photoresist layer is removed thereafter in one etching operation.

22. The method according to claim 20, wherein the first and second photoresist layers are removed in a single etching operation.

23. The method according to claim 20, further comprising etching the underlying conductive layer, using the masking portion comprising the second photoresist material, to form a conductive line of a conductive pattern.

24. The method according to claim 20, wherein the first photoresist layer and sidewall spacer are removed by blanket etch back.

25. The method according to claim 18, comprising:
    forming a mask pattern in the first photoresist layer comprising a plurality of openings, each opening having a first dimension; and
    depositing a thin film of dielectric material in each opening to form a dielectric sidewall spacer therein to reduce each first dimension to a second dimension defined by the dielectric sidewall spacer.

26. The method according to claim 25, further comprising removing the first photoresist layer and dielectric sidewall spacer in each opening leaving a mask pattern containing a plurality of masking portions each comprising the second photoresist material.

27. The method according to claim 26, further comprising etching the underlying conductive layer, using the mask pattern, to form a plurality of conductive lines of a conductive pattern.

28. The method according to claim 25, wherein the first photoresist layer and dielectric sidewall spacers are removed by blanket etch back.

29. The method according to claim 17, wherein the first photoresist layer comprises a positive or negative working photoresist material.

30. The method according to claim 17, wherein the conductive layer comprises a metallic material or polycrystalline silicon.

* * * * *